United States Patent
Haggar et al.

(12) 
(10) Patent No.: US 6,459,392 B1
(45) Date of Patent: Oct. 1, 2002

(54) TECHNIQUE FOR ENCODING A SEQUENCE OF PERIODIC BYTE VALUES WITH VERTICAL CORRELATION

(75) Inventors: Peter F. Haggar, Raleigh; James A. Mickelson, Cary; David M. Wendt, Apex, all of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/766,518

(22) Filed: Jan. 19, 2001

(51) Int. Cl.$^7$ ................................................. H03M 7/30
(52) U.S. Cl. ........................................... 341/87; 341/50
(58) Field of Search ..................... 341/87, 50; 707/101, 707/100

(56) References Cited

U.S. PATENT DOCUMENTS

| | | | | |
|---|---|---|---|---|
| 4,280,192 A | * | 7/1981 | Moll ........................... 341/155 |
| 4,369,472 A | | 1/1983 | Takaka et al. ................. 360/40 |
| 4,888,645 A | * | 12/1989 | Mitchell et al. ......... 358/261.1 |
| 4,953,214 A | | 8/1990 | Takeguchi et al. ............. 381/31 |
| 5,195,098 A | | 3/1993 | Johnson et al. ............. 371/37.2 |
| 5,542,063 A | | 7/1996 | Kittaka ....................... 395/428 |
| 5,600,316 A | * | 2/1997 | Moll ........................... 341/87 |
| 5,635,932 A | * | 6/1997 | Shinagawa et al. ........... 341/51 |
| 5,710,919 A | * | 1/1998 | Rail ........................... 707/101 |
| 5,757,970 A | | 5/1998 | Callahan et al. ............. 382/236 |
| 6,026,348 A | | 2/2000 | Hala ........................... 702/56 |
| 6,038,536 A | | 3/2000 | Haroun et al. .............. 704/500 |

* cited by examiner

*Primary Examiner*—Peguy JeanPierre
(74) *Attorney, Agent, or Firm*—Gregory M. Doudnikoff; Marcia L. Doubet (57) ABSTRACT

The present invention provides a method, system, and computer program product for encoding (and subsequently decoding) a sequence of periodic byte values that have a vertical correlation (e.g. so that they can be more efficiently stored and/or electronically transmitted for use in a real-time system or resource-constrained system). Redundant values are omitted through use of marker bytes and bits masks which indicate when a set of values is unchanged and which of the set have changed, respectively. In this manner, the resources required for transmitting, processing, and/or storing the values is reduced. In some systems, the reduction may enable shortening the periodic interval length, such that values of a finer granularity can be processed. An example scenario in which the present invention may be used advantageously is for transmitting periodic input data to a robot controller, in order to control movement of the robot.

24 Claims, 7 Drawing Sheets

| col. 1 | col. 2 | col. 3 | col. 4 | col. 5 |
|---|---|---|---|---|
| 0x80 | 0xEA | 0x29 | 0x0C | 0xC8 |
| 0x80 | 0xEA | 0x29 | 0x0C | 0xC8 |
| 0x80 | 0xB2 | 0x29 | 0x0C | 0xC3 |
| 0x80 | 0xB2 | 0x29 | 0x0C | 0xC3 |

| col. 1 | col. 2 | col. 3 | col. 4 | col. 5 |
|--------|--------|--------|--------|--------|
| 0x80   | 0xEA   | 0x29   | 0x0C   | 0xC8   |
| 0x80   | 0xEA   | 0x29   | 0x0C   | 0xC8   |
| 0x80   | 0xB2   | 0x29   | 0x0C   | 0xC3   |
| 0x80   | 0xB2   | 0x29   | 0x0C   | 0xC3   |

FIG. 3B

| 0x1F | 0x80 | 0xEA | 0x29 | 0x0C | 0xC8 | 0x81 | 0x09 | 0xB2 | 0xC3 | 0x81 |
|------|------|------|------|------|------|------|------|------|------|------|
| bit mask | column values for columns 1 - 5 | | | | | marker byte | bit mask | column values for columns 2 and 5 | | marker byte |

```
        Variables
            N = number of columns
            P[1]-P[N] = byte storage for previous values
            X[1]-X[N] = byte storage for current row (interval)
410         I,J,K = index registers
            B = byte bitmask for current row
            C = current number of non-changing rows
            D = number of changed values in current row 420  Logic
            input/output OB = output buffer as zero-based
              byte array initialize all variables to zero
430         load N with number of columns (min 1, max 7)

loop until all intervals read read interval values into X[1]-X[N]
                loop J=1 to N
                   shift B left 1 bit
                   if X[J] <> P[J]
440                   incr D
      450             incr B
                      OB[I+D] <- X[J]
                      P[J] <- X[J]
                   endif
                endloop
```

| FIG. 4A |
|---------|
| FIG. 4B |

```
            if B <> 0
               if K > 0
                  set bit 7 in C
          465     OB[K] <- C
     460          K <- 0
                  C <- 0
               endif
               OB[I] <- B
               I <- I + D + 1
               B <- 0
               D <- 0
440
            else
               if K > 0
                  incr C
                  if bit 7 set in C
     470 475        OB[K] <- 0xFF
                     incr K
                     incr I
                     C <- 1
                  endif
               else
                  K <- I
     480          incr I
                  C <- 1
               endif
            endif
         endloop if K > 0
            set bit 7 in C
     490    OB[K] <- C
         endif
```

```
Variables
      ┌ N = number of columns
      │ I,J = index registers
  510 │ C = current number of non-changing rows (intervals)
      └ D = number of changed values in current row Logic
        input IB = input buffer as zero-based byte array
                   (from encoder)

┌ initialize all variables to zero
  520 │ load N with number of columns (min 1, max 7)
      └

┌ loop for each interval until data in IB used
      │
      │       if C > 0
      │         decr C
      │       else
      │     ┌   if IB[I] > 127
      │     │     set C using bits 0-6 of IB[I]
      │     │   else
      │     │ ┌   loop J=1 to N
  530 540 550│ │     if bit N-J set in IB[I]
      │     │ │560    incr D
      │     │ │       send byte IB[I]+D to output device
      │     │ │     endif
      │     │ └   endloop
      │     │     I <- I + D
      │     │     D <- 0
      │     └   endif
      │
      │   570 incr I
      │       endif
      │
      └ endloop
```

TECHNIQUE FOR ENCODING A SEQUENCE OF PERIODIC BYTE VALUES WITH VERTICAL CORRELATION

BACKGROUND OF THE INVENTION

1. Field of the Invention

The present invention relates to a computer system, and deals more particularly with a method, system, and computer program product for encoding (and subsequently decoding) a sequence of periodic byte values that have a vertical correlation (e.g. so that they can be more efficiently stored and/or electronically transmitted for use in a real-time system or resource-constrained system).

2. Description of the Related Art

There are many computing applications for which the delivery time of electronically-transmitted information is critical. Processing time for the received information may also be critical in these applications, and for that matter, processing time may be critical in applications where delivery time is not an issue. Examples of computing applications where delivery and processing time are both typically sensitive to particular constraints include real-time systems such as computer-controlled robots, air-traffic control systems, and so forth. In some computing devices, the memory and/or storage resources (hereinafter referred to as memory resources) used by computing applications are also of critical importance, especially with the on-going trend for smaller and smaller computing devices (such as handheld or wearable computers, Web-enabled cellular phones, etc.).

By way of review, real-time systems are those in which an executing application must respond to incoming events within some time period imposed by external constraints (which are typically application-specific). In the case of a computer-controlled robot, for example, it may be necessary to ensure that the robot's arm moves to a particular location before a widget is released at that location. Thus, the instructions that tell the robot to move its arm and the positional information that conveys the target destination must be received and processed by the time the widget is released. As another example, a graphics-intensive application such as a computer-generated movie animation, a virtual reality simulator, or a time-lapse weather map that graphically simulates changing weather conditions may need to receive and process new information very rapidly in order to generate a display with smooth transitions and no unnatural "jerkiness".

For purposes of the present invention, any systems and applications having the types of information receipt, processing, and/or storage constraints that have been described will be referred to hereinafter as "real-time systems" and "real-time applications" for ease of reference. Furthermore, the terms "real-time applications" and "real-time systems" are used interchangeably hereinafter, unless otherwise stated, when referring to these types of applications and the systems on which they execute.

When an application has information receipt and/or processing time constraints, one way to ensure that the application will meet those constraints is to reduce the amount of information transmitted to it (e.g. by transmitting less frequently). However, this is not always a practical solution. In the case of robots, for example, reducing the amount of information may result in jerky movements: while this result may be tolerable if the robot is designed to clean a factory floor, it is not acceptable for other applications such as robotically-performed surgery.

One common measure used by real-time systems is the "period" of a particular task. The period is an interval of time representing the natural frequency of execution of that task. In the case of the virtual reality simulator, for example, the application may be designed to receive and process information some number of times per second, where the particular number is designed to enable a perceiving human user to believe that the simulation does in fact model the real world. This particular number is then a period of the simulator application. (Distinct periods may exist for different types of data input used by an application.) When the period can be reduced, information of a finer granularity can be sent to and processed by the simulator, resulting in a more realistic result. However, it may happen that the computing system on which the simulator application executes does not have sufficient storage for very fine-grained information; or, the volume of data transmitted may overrun the application's or system's processing capability. Therefore, in this virtual reality scenario (as well as in other real-time scenarios), it is important that the flow of input (i.e. control) information is optimized to ensure that processing and usage of memory resources are efficient.

Accordingly, what is needed is an improved technique for sending information to applications that may be constrained as to delivery time, processing time, and/or memory.

SUMMARY OF THE INVENTION

An object of the present invention is to provide an improved technique for sending information to systems and applications that may be resource-constrained.

Another object of the present invention is to provide a technique for sending information to systems and applications where delivery time, processing time, and/or memory resources must be optimized.

Another object of the present invention is to provide a technique for efficiently encoding information into a compressed format.

Yet another object of the present invention is to provide an improved technique for encoding information that is to be transmitted, processed, and/or stored in a computing system.

Still another object of the present invention is to provide an improved technique for encoding information that has a vertical correlation among particular values.

A further object of the present invention is to provide an encoding technique that enables resource-constrained systems to handle finer-granularity information.

Other objects and advantages of the present invention will be set forth in part in the description and in the drawings which follow and, in part, will be obvious from the description or may be learned by practice of the invention.

To achieve the foregoing objects, and in accordance with the purpose of the invention as broadly described herein, the present invention provides a method, system, and computer program product for efficiently encoding a sequence of data values that have a vertical correlation. This technique comprises: accessing a plurality of data values, wherein the plurality of data values is logically structured as a plurality of rows, each of the rows having a plurality of columns; and encoding the plurality of data values as a compressed output stream. The encoding further comprises: omitting selected ones of the plurality of data values from the output stream, wherein the selected ones are those data values which are repeated from one column in one row to that column in a next-sequential row; and indicating the omission in the output data stream without loss of information content.

The technique may further comprise transmitting the compressed output stream to a receiver. In this case, the technique may also comprise: receiving, at the receiver, the transmitted output stream; and decoding the received output stream into the logical structure of the plurality of rows and the plurality of columns. The decoded output stream may then be used as periodic input for an application. The application may be a real-time application.

The encoding may further comprise: creating a marker byte to indicate how many sequential rows have identical data values in each column; creating a bit mask for each row that has changed data values, wherein one or more bits in the bit mask are set on for each column in the row which has one of the changed data values; and writing the marker bytes and the bit masks into the output stream, along with the changed data values.

The data values may be byte values. Each of the rows preferably represents a periodic set of data values.

The present invention will now be described with reference to the following drawings, in which like reference numbers denote the same element throughout.

DESCRIPTION OF THE PREFERRED EMBODIMENT

Figure 1:
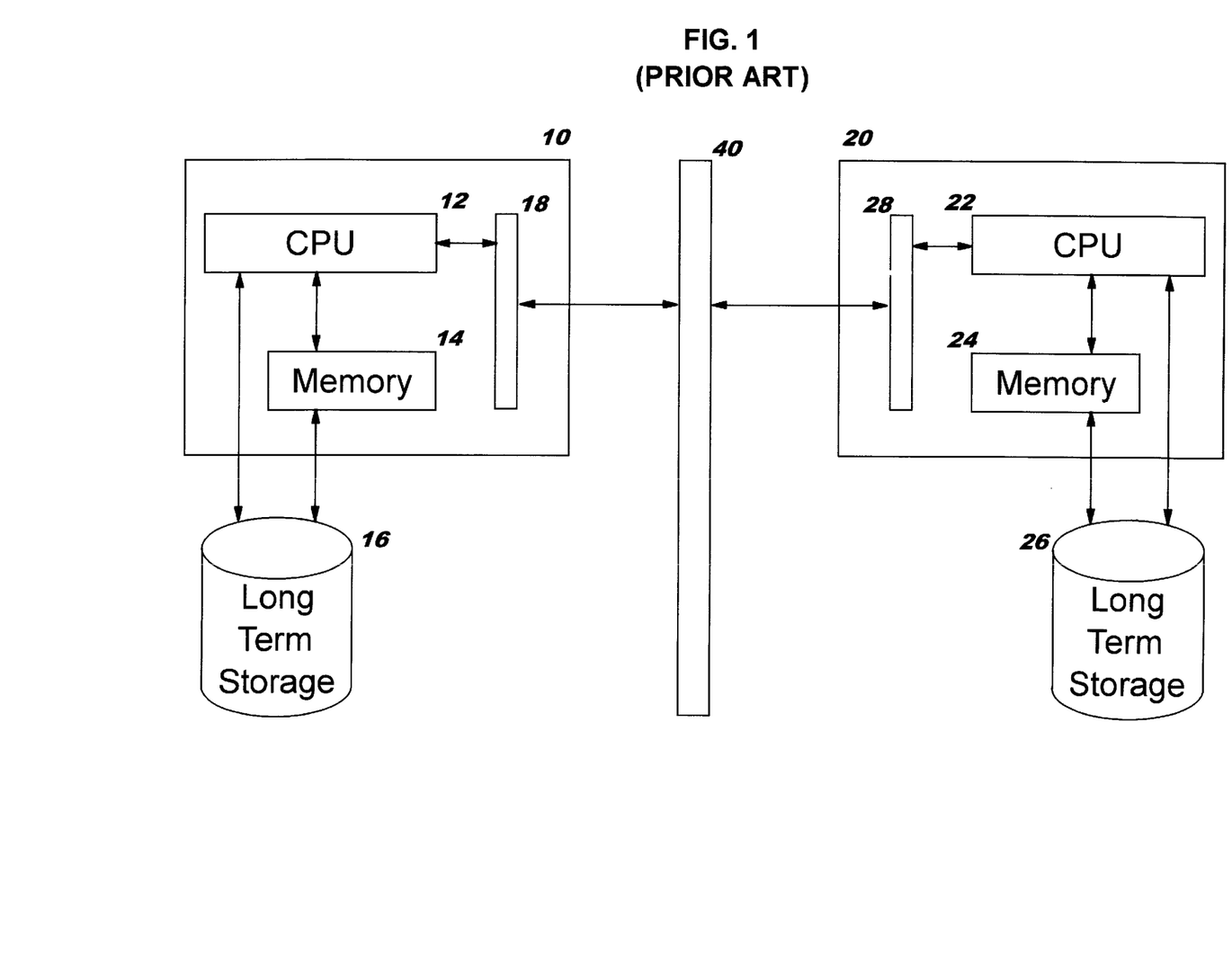
FIG. 1 is a block diagram illustrating computing devices in which the present invention may be practiced.

FIG. 1 illustrates representative computing devices in which the present invention may be practiced. Typically, a first computing device 10 will generate information to be transmitted to, and processed by, an application executing on a second computing device 20. A transmission between machines typically occurs using a network 40. In an alternative configuration (not shown in FIG. 1), the information may be transmitted from one process to another within a single machine, or may be transmitted between machines in alternative manners (including direct attachment to a communications channel).

Computing device 10 is preferably a standard computing device of the type that is commercially available, and comprises a central processing unit (CPU) 12, memory 14 (which may be primary and/or secondary memory), long-term storage 16 (which can include one or more of a hard drive, diskette drive, tape drive, etc.), and network transmission capability 18. Similarly, computing device 20 is preferably a standard, commercially-available computing device, and also comprises a CPU 22, memory 24 (which may be primary and/or secondary memory), one or more types of long-term storage 26, and network transmission capability 28. Alternatively, computing device 20 may use ROM memory 24 and not contain long-term storage 26. Computer program instructions that implement the present invention are preferably stored in the memory 14 and memory 24 (and/or in storage 16, 26). The programming instructions stored in memory 14 comprise instructions for encoding information to be transmitted to device 20, and the programming instructions stored in memory 24 comprise instructions for decoding information that has been received from device 10).

Computing device 10 may be a server or mainframe, a single-user workstation, or any other type of computing device that has information to be transmitted to another device or process. When computing device 20 is a separate device, it may be a resource-constrained device such as the controller for a robot, a microprocessor within a "smart" appliance in the home, or any other type of computing device that needs to receive and process information efficiently. (Furthermore, the present invention may be used advantageously even though the receiving computing device 20 is not resource-constrained.)

Network 40 may be a local area network (LAN) or a wide area network (WAN), or computing devices 10 and 20 may operate in a client/server or peer-to-peer network, or any other type of networking configuration may be used. Such configurations, as well as the appropriate communications hardware and software, are known in the art.

Figure 2:
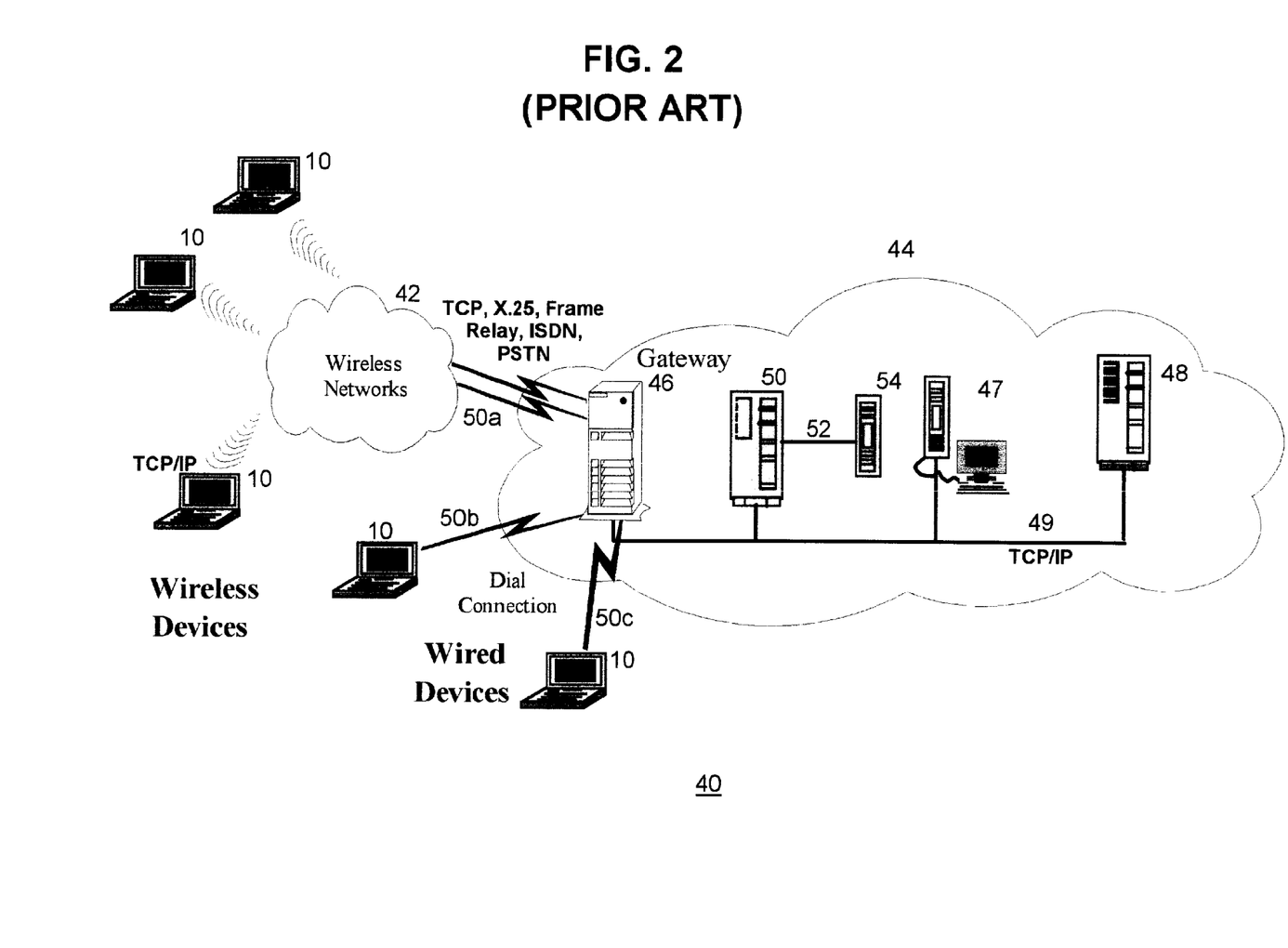
FIG. 2 is a diagram of a networked computing environment in which the present invention may be practiced.

FIG. 2 illustrates an example network configuration 40 in which the present invention may be practiced. The network 40 may include a plurality of individual networks, such as wireless network 42 and network 44, each of which may include a plurality of individual computing devices of the type described with reference to FIG. 1. Additionally, as those skilled in the art will appreciate, one or more LANs may be included (not shown), where a LAN may comprise a plurality of intelligent workstations coupled to a host processor.

Still referring to FIG. 2, the networks 42 and 44 may also include mainframe computers or servers, such as a gateway computer 46 or application server 47 (which may access a data repository 48). A gateway computer 46 serves as a point of entry into each network 44. The gateway 46 may be preferably coupled to another network 42 by means of a communications link 50a. The gateway 46 may also be directly coupled to one or more wired or wireless devices 10 using a communications link 50b, 50c. The gateway computer 46 may be implemented utilizing an Enterprise Systems Architecture/370 available from the International Business Machines Corporation (IBM), an Enterprise Systems Architecture/390 computer, etc. Depending on the application, a midrange computer, such as an Application System/400 (also known as an AS/400) may be employed. ("Enterprise Systems Architecture/370" is a trademark of IBM; "Enterprise Systems Architecture/390", "Application System/400", and "AS/400" are registered trademarks of IBM.)

The gateway computer 46 may also be coupled 49 to a storage device (such as data repository 48). Further, the gateway 46 may be directly or indirectly coupled to one or more devices 10. A real-time system 50 and real-time controller 54 (which together may comprise the second computing device 20 of FIG. 1) are coupled to gateway 46 for purposes of communicating with a device 10. Typically, system 50 is coupled to controller 54 via a direct connection 52. In the case of a robot, for example, controller 54 is a robot controller and is typically operably coupled to a movable part of the robot such as the robot arm (not shown in FIG. 2).

Those skilled in the art will appreciate that the gateway computer 46 may be located a great geographic distance from the network 42, and similarly, the devices 10 may be located a substantial distance from the networks 42 and 44. For example, the network 42 may be located in California, while the gateway 46 may be located in Texas, and one or more of the devices 10 may be located in New York. The devices 10 may connect to the wireless network 42 using a networking protocol such as the Transmission Control Protocol/Internet Protocol ("TCP/IP") over a number of alternative connection media, such as cellular phone, radio frequency networks, satellite networks, etc. The wireless network 42 preferably connects to the gateway 46 using a network connection 50a such as TCP or UDP (User Datagram Protocol) over IP, X.25, Frame Relay, ISDN (Integrated Services Digital Network), PSTN (Public Switched Telephone Network), etc. The devices 10 may alternatively connect directly to the gateway 46 using dial connections 50b or 50c. Further, the wireless network 42 and network 44 may connect to one or more other networks (not shown), in an analogous manner to that depicted in FIG. 2.

In the preferred embodiment, the present invention is implemented in computer software. Alternatively, the present invention may be embodied in hardware, or in a combination of software and hardware. In a software embodiment, as depicted in FIG. 2, software programming code which embodies the present invention is typically retrieved by the CPU 12 and 22 from long-term storage media 16 and 26 of some type, such as a CD-ROM drive or hard drive, and loaded into memory 14 and 24. Alternatively, some or all of the software programming code may be retrieved directly from ROM memory 14 and 24. The software programming code may be embodied on any of a variety of known media for use with a computing system, such as a diskette, hard drive, or CD-ROM. The code may be distributed on such media, or may be distributed from the memory or storage of one computing device over a network of some type to other computing devices for use by such other devices. Alternatively, the programming code may be accessed directly from long-term storage 16 and/or 26. The techniques and methods for embodying software programming code in memory, on physical media, and/or distributing software code via networks are well known and will not be further discussed herein.

Note that while the discussions herein are in terms of a first computing device transmitting encoded information to a second computing device, this is for purposes of illustration and not of limitation. Other scenarios are also within the scope of the present invention. As has been discussed, such other scenarios include transmission of encoded information from one process to another process within a single computing device. Furthermore, a first computing device (or process) may encode information and transmit that encoded information to multiple target devices (or processes). Hereinafter, reference to a transmitting or receiving computing device includes a transmitting or receiving process as well as multiple receiving devices and receiving processes.

The present invention defines an improved technique for transmitting information from one computing device to another by encoding that information in an efficient manner that capitalizes on vertical correlations among the data values. The encoded information can be efficiently decoded for processing at the receiving device.

As an example of data that has a vertical correlation, suppose a multi-axis robot has a number of independent positional motor controls. Target position values at a particular point in time may be specified for each axis. To control the movement of the robot, these position values are typically transmitted (and processed) at uniform intervals. A collection of target position values for some number of intervals may be represented (conceptually as well as physically) as a table of data, where the values in each column are values for a particular position at different ones of the intervals and the values in each row are the set of values for each position at some particular point in time. The values in the rows of the table correspond to the information that is used to control the robot's movement at uniform intervals. As will be described, the present invention defines an efficient technique for reducing the amount of data that must be transmitted while still preserving the information content.

Another example of data having a vertical correlation is a multi-character indicator on a wireless device (such as a display for a smart appliance in the home, a digital phone, etc.). It may be desirable to make periodic updates to the display field at relatively short intervals. In this example, the columns of the table may represent the multiple character positions on the display while the rows represent the changing values to be displayed in those positions at each periodic update. Or, the columns may represent multiple positions as well as attributes (such as color) for the character to be displayed at that position. In this case, the values in each row preferably specify a set of characters and attribute values for those characters.

Many prior art systems used in these types of scenarios send each row in its entirety. However, sending all of the values at each interval is an inefficient transmission technique that wastes communication bandwidth, and may lead to overrunning the capabilities of the receiving device. One way in which prior art systems address this concern is to increase the period interval, thereby transmitting data less frequently. The disadvantages of this approach have been discussed above. Other prior art systems may attempt to reduce the amount of data transmitted by looking for relationships in neighboring data values or across column data in a horizontal fashion. For example, the well-known Lempel-Ziv compression technique looks for relationships among neighboring bytes in a data stream and uses these relationships to reduce the size of the data stream.

When a vertical correlation exists among the rows of a table of the type described—that is, when data is to be transmitted that specifies periodically-changing values for a fixed set of parameters or columns—the encoding technique of the present invention can be used advantageously to minimize the amount of data that must be transmitted. In particular, the present invention transmits only changes in position values. As a result, input/output traffic, transmission time, and memory requirements are reduced. These reduced resource requirements may enable reducing the periodic interval, thereby providing information with a finer granularity (depending on the characteristics of a particular application with which the present invention is used).

In the preferred embodiment, up to 7 independent columns of byte values (i.e. values from 0 to 255 hexadecimal) are compressed using the novel encoding technique defined herein. It will be obvious to one of ordinary skill in the art how this encoding technique may be expanded to accommodate more than 7 columns of data, based upon the teachings herein (e.g. by using multiple bytes instead of a single byte for the bit mask described below).

Figure 3A:
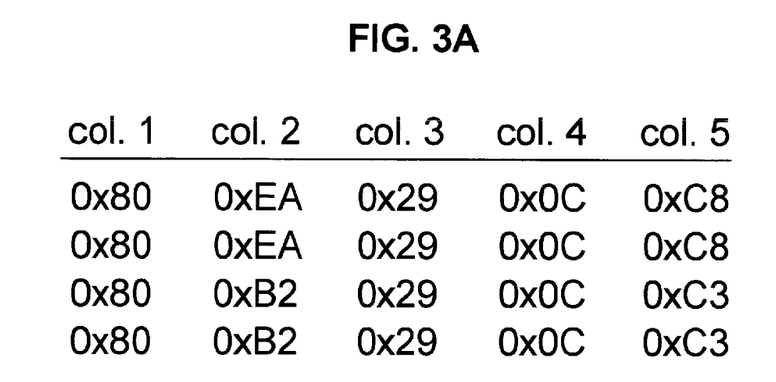
FIGS. 3A and 3B provide an example of periodic input values with a vertical correlation, and a result of encoding that information, respectively, to illustrate operation of the preferred embodiment of the present invention.

FIG. 3A illustrates an example table that has 4 rows of periodic data values with a vertical correlation, each row having 5 columns, that will be used as input to describe operation of the preferred embodiment of the encoding technique of the present invention. In prior art systems, a periodic task is normally created to send a row of these values to an external device via an output network interface or channel at an appropriate interval. For this example table, this prior art approach would result in sending 20 bytes of values. However, note that the first 2 rows of this table are identical. Furthermore, the only difference between rows 2 and 3 is the changed values in columns 2 and 5, and row 4 is identical to row 3. Thus, transmitting the entire table results in transmission of a significant amount of redundant information.

Figure 3B:
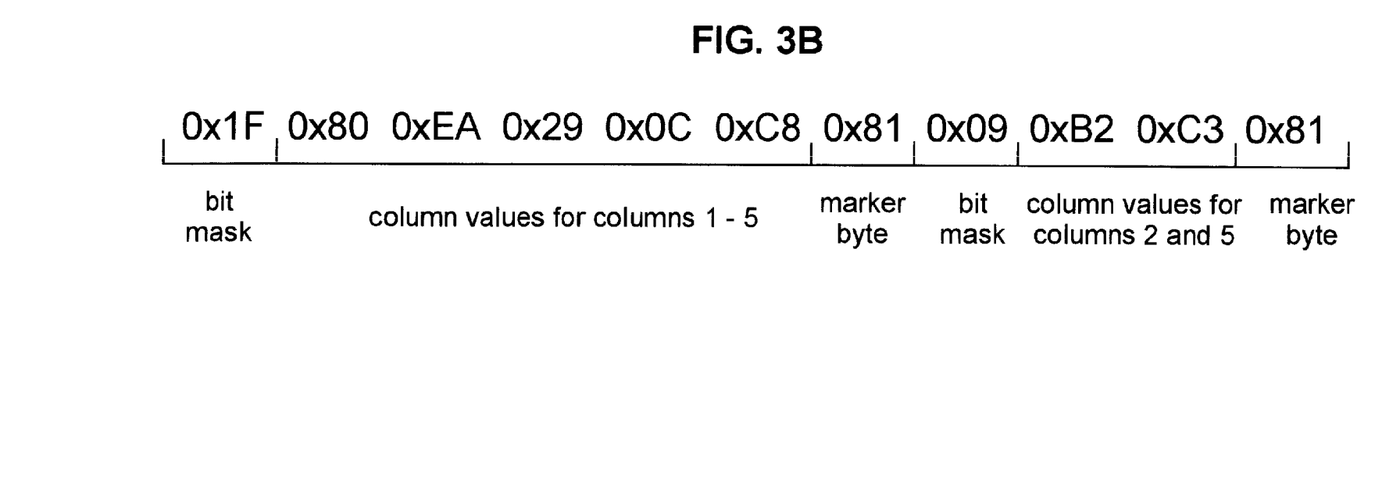

By encoding the example table of FIG. 3A according to the preferred embodiment of the present invention, these 20 bytes can be reduced to the 11 bytes shown in FIG. 3B. (As will be obvious, significant benefits will be realized for tables having more rows than shown in this example, including tables that continue to grow dynamically as periodic data is generated.) The manner in which this encoding technique operates to create an output sequence will now be described in general terms. The pseudocode in FIG. 4, which describes the logic of an algorithm that may be used to implement this encoding technique, will then be discussed. Operation of this algorithm will be illustrated with reference to the interim results in FIGS. 6A through 6I. Finally, a decoding technique will be described with reference to the pseudocode in FIG. 5.

At each time interval represented in the input table, the values of zero or more of the columns in the table change. The encoding technique of the present invention places a bit mask byte in the output stream to identify changed columns and a marker byte to collapse blocks of non-changing rows. (Depending on the interval size and the complexity of the example data, as well as the behavior of a particular real-time application, the number of changes occurring in each interval will vary. Generally, a short interval combined with comparably infrequent changes will require the fewest updates per interval.)

Figures 4, 4A:
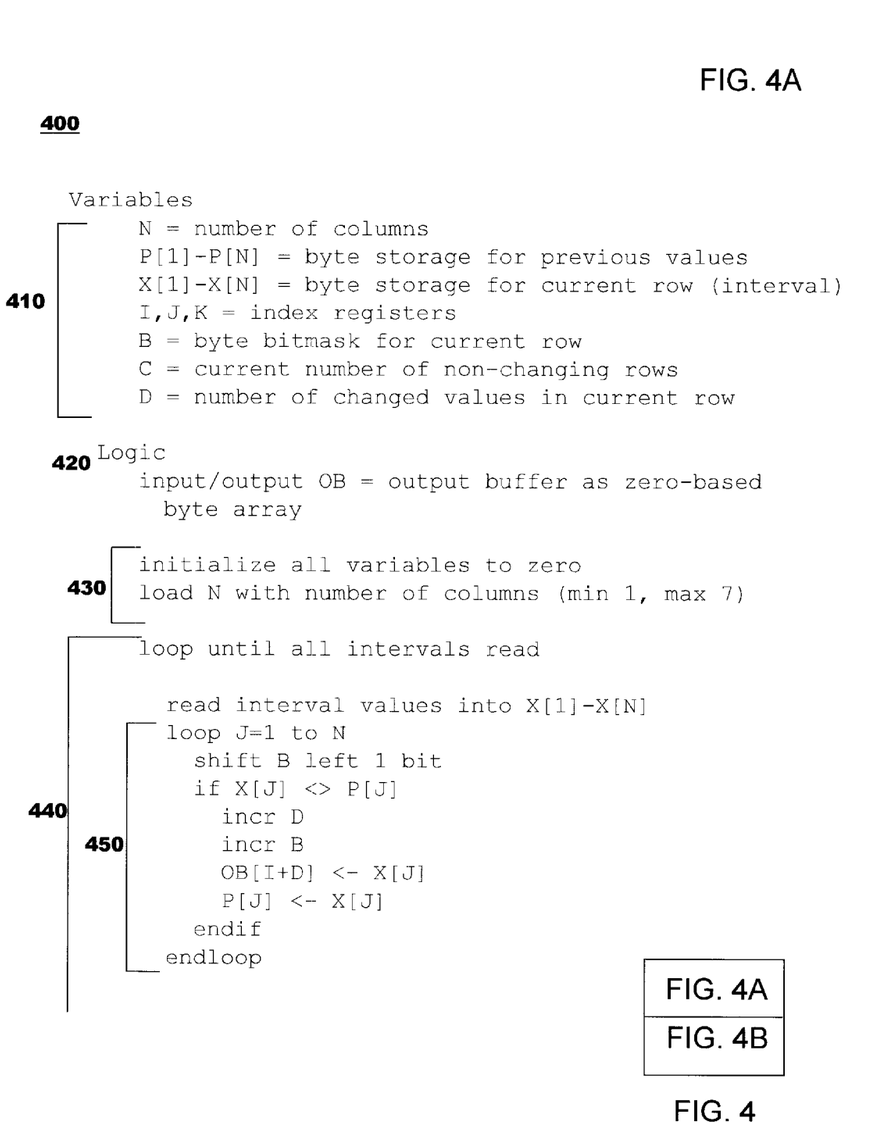
FIGS. 4 and 5 provide pseudocode to illustrate the logic that may be used to implement the encoding and decoding techniques, respectively, of the preferred embodiment of the present invention.

In the preferred embodiment, the first byte of the encoded output sequence defines the number of columns in the table. According to the algorithm in FIG. 4, this value is always one of the following:

| Value (in hex) | |
| --- | --- |
| 0 × 7F | for 7 columns of input values |
| 0 × 3F | for 6 columns |
| 0 × 1F | for 5 columns |
| 0 × 0F | for 4 columns |
| 0 × 07 | for 3 columns |
| 0 × 03 | for 2 columns |
| 0 × 01 | for 1 column |

This byte is immediately followed by the initial values for each column, in the same order as the values appear in the columns of the input table. All columns must be represented by a 1-byte value. For the example table in FIG. 3A, the byte sequence written to an output stream to represent the first row (in hex) is:

1F 8 EA 29 0C C8

The encoding of the subsequent intervals begins by determining the differences in values from one row to the next, based on the vertical correlation among the columns. That is, the value in a particular column for one row (representing a previous interval) is compared to the value for that column in the next row (representing a current interval). This process is repeated for each of the columns. If the differences for all the columns are 0, then it is not necessary to transmit the (redundant) values from this row. Instead, a counter is incremented until a row is found where at least one column value has changed. Once this row has been found (or the end of the table, or sequence to be transmitted, is reached), a marker byte is created to indicate the number of non-changing rows (i.e. the number of intervals where no change occurred). In the preferred embodiment, the high-order bit of this marker byte is always set on (i.e. it has the value 1). The remaining 7 bits represent, in hexadecimal, the number of non-changing rows. If the number of non-changing rows exceeds 127, more marker bytes are added until the cumulative total of the marker bytes reaches the appropriate row count. For the example data in FIG. 3A, where the second row is unchanged as compared to the first row, but a change occurs in the third row, the count of non-changing rows at this point is therefore 1. Thus, the marker byte is encoded as 0×81 (i.e. '1000 0001'B, where the 1 in the high-order bit signifies that this is a marker byte and the 1 in the low-order bit represents the count of 1 non-changing row).

When a row is encountered with at least 1 column value changed, the first byte appearing in the output stream for this changed row indicates which column values have changed. In the preferred embodiment, the interpretation of the bit pattern in this byte is dependent on the number of columns in the table. (Setting each of the appropriate bits in these bit patterns occurs according to the algorithm of FIG. 4.) For a 7-column table, the following bits are used:

| Bit | |
| --- | --- |
| 7 | always set to 0 (high-order bit) |
| 6 | indicates whether column 1 changed |
| 5 | indicates whether column 2 changed |
| 4 | indicates whether column 3 changed |
| 3 | indicates whether column 4 changed |
| 2 | indicates whether column 5 changed |
| 1 | indicates whether column 6 changed |
| 0 | indicates whether column 7 changed |

For a 5-column table, such as that shown in FIG. 3A, the following bits are used:

| Bit | |
| --- | --- |
| 7 | always set to 0 (high-order bit) |
| 6 | always set to 0 (not used) |
| 5 | always set to 0 (not used) |
| 4 | indicates whether column 1 changed |
| 3 | indicates whether Column 2 changed |
| 2 | indicates whether column 3 changed |
| 1 | indicates whether column 4 changed |
| 0 | indicates whether column 5 changed |

The bytes following this bit mask byte are the new (i.e. changed) values for the changed row, in the order of their appearance in the table (and in the order indicated by the bit settings in the bit mask). Values of any columns that did not change within this row are not written to the output stream. For the example table, the third row would therefore be encoded (in hexadecimal) as:

09 B2 C3

The first of these bytes, 0×09 ('0000 1001'B) is the bit mask which signifies that the values in columns 2 and 5 have changed, as compared to the prior row (and the previous interval). The second and third of these bytes specify the changed values.

The complete encoding for the example table in FIG. 3A is therefore (in hexadecimal):

1F 80 EA 29 0C C8 81 09 B2 C3 81 as shown in FIG. 3B, wherein the output stream has been annotated to show the meaning of the various bytes.

Referring now to the algorithm represented by the pseudocode 400 in FIG. 4, the interim output sequences in FIGS. 6A through 6I will be used to illustrate operation of the algorithm on the example input data in FIG. 3A. The variables used by this algorithm are defined as shown at element 410. A variable "N" represents the number of columns in the input table. For the example table in FIG. 3A, N has the value 5. A 1-dimensional array P[1] through P[N] is used to store the column values for the previous row or interval, and a 1-dimensional array X[1] through X[N] stores the column values for the current row. A variable "T" is used as an index into the output buffer "OB" that is being constructed. Variable "K" also points into this output buffer. (During the processing of each row, variable I points to the next available position for storing a changed byte in the output buffer, and K points to a position which precedes the location of variable I and which is reserved for storing a marker byte or a bit mask byte.) Variable "J" is used as a loop counter while processing the columns of each row. Preferably, index registers are used for variables I, J, and K in order to optimize the speed of the algorithm. A variable "B" stores the bit mask for the current row, and variable "C" stores a count of the number of non-changed rows. Variable "D" stores a count of the number of changed columns in the current row.

Figure 4B:
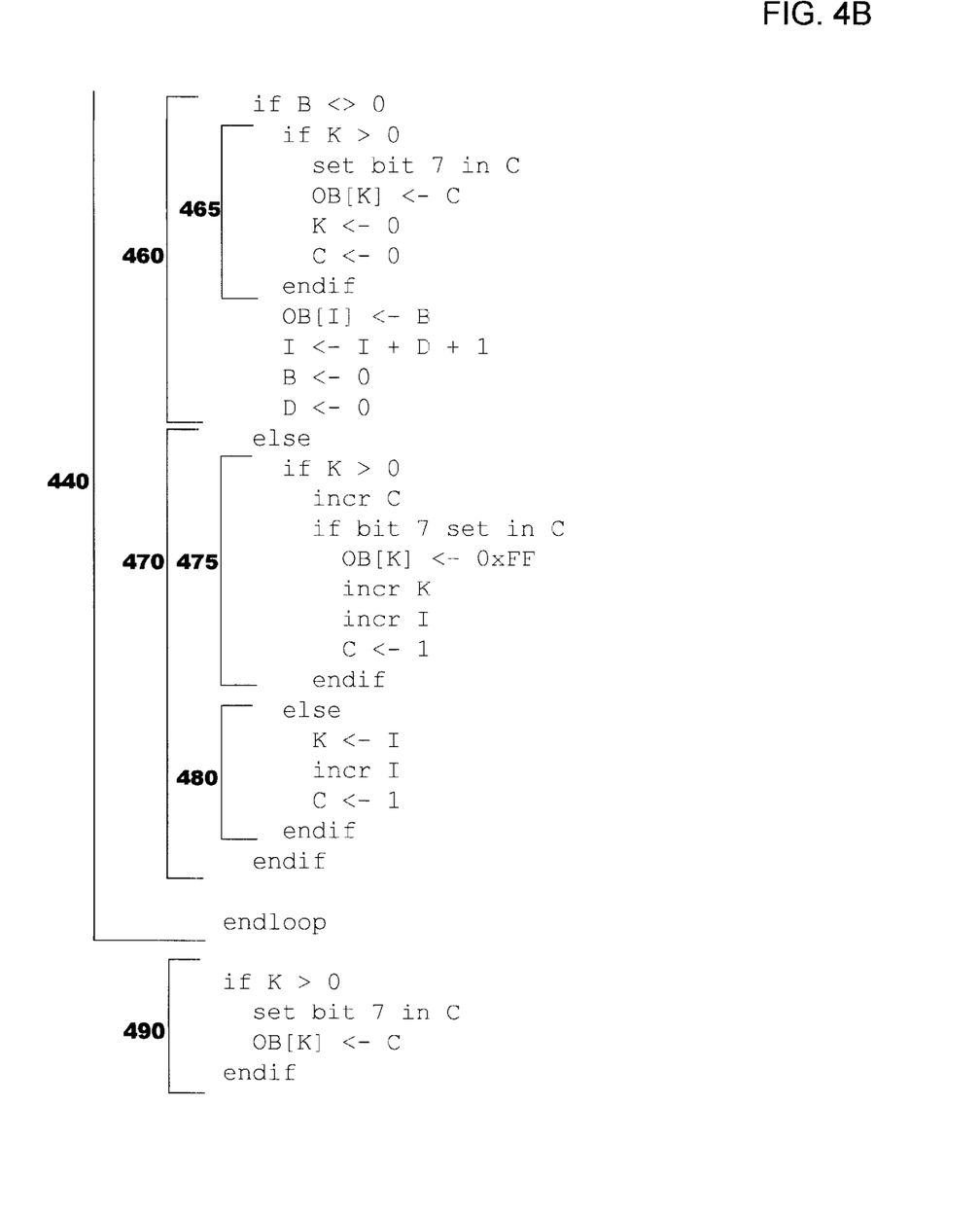

The logic of the algorithm in FIGS. 4A and 4B is shown at element 420. The output buffer OB (referred to herein equivalently as an output stream) is preferably defined as a zero-based 1-dimensional array or stream of bytes. The algorithm begins (see element 430) by initializing all the variables (as described at element 410) to zero and then setting N to the number of columns in the table (where N=5 for the example).

Next, a loop depicted at element 440 is performed for each row, until all the rows in the table have been read and processed. This loop begins by setting X[1] through X[N] to the column values from the current row. The loop shown at 450 is iterated for each of the (J=1 to N) columns in this row. First, the bit mask B is shifted one bit position to the left. In this manner, the change flag bit for the current (J-th) column can be set, if the column contains changed data, simply by adding 1 to the bit mask, irrespective of which column it is that changed. The data value in the current J-th column (stored in X[J]) is then compared to the data value in the J-th column of the previous row (stored in P[J]). If these values are identical, loop 450 is complete for this value of J, and J is then incremented for another iteration (unless all N columns have been processed, in which case control transfers to the if statement that begins at 460). When the values are not identical, however, the number of changed columns is incremented (in variable D); the change bit for the current column is set on (by incrementing variable B, as just discussed); the data value of the changed column is written to the next available position in the output buffer (which is the location having index I+D); and this changed data value is also stored in the "previous row values" buffer at position P[J].

Figure 6A:
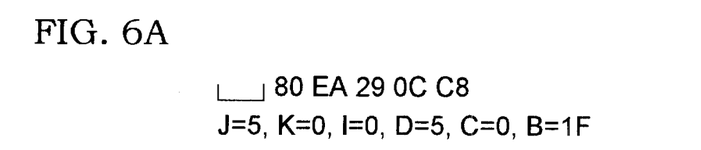
FIGS. 6A through 6I show interim results of operation of the encoding technique illustrated in FIG. 5, as applied to the example data in FIG. 3A.

Each full iteration of loop 450 finds the changes in the current row, counts them, writes them to the output buffer, remembers them for processing the next row, and sets the bit mask accordingly to reflect the columns that have changed as compared to the previous row. At the completion of loop 450 for the first row of an input table, the output buffer contains the initial values for each row. (By definition, each of these columns represents a change when the algorithm first operates, and thus the statements within the if clause of loop 450 are executed for each column.) After processing the first row of the example table up through loop 450, the output buffer and variables are as shown in FIG. 6A.

The if statement shown at 460 and 470 executes next. If bit mask B is not zero (i.e. if this row contained changed columns), the if clause 460 executes; otherwise, else clause 470 executes. Following completion of either clause 460 or clause 470, control returns to the top of loop 440 to load the next row into X[1] through X[N] and process this row, unless all rows have already been processed. In the latter case, the logic of if statement 490 is executed to complete the output buffer.

Figure 6B:
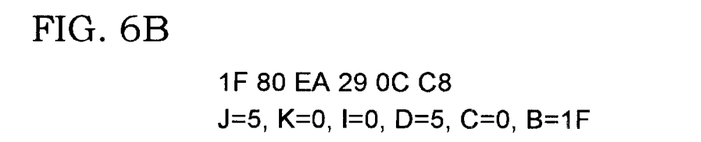

Turning now to the if clause at 460, K has a non-zero value only when it has been necessary to write at least one marker byte into the output buffer. Thus, working through the example in FIG. 3A, the embedded if clause at 465 will be skipped. The bit mask in B is then written to the output buffer, in a position (indexed by variable I) that precedes the locations where the changed values it represents have already been written. Referring to the example, the output buffer now has the values shown in FIG. 6B. Because all 5 columns of this first row are considered changed, the first bit mask has the value 0x1F ('0001 1111'B). Variable I is then incremented to move past the last changed column value in the output buffer, to the next available position, by adding (D+1) to the current value of I. The bit mask B and changed-column counter D are then reset, and processing returns to the top of loop 440. The output buffer and variables resulting from processing the example table have the values shown in FIG. 6C.

Figure 6C:
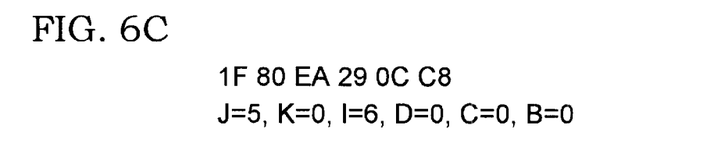
Figure 6D:
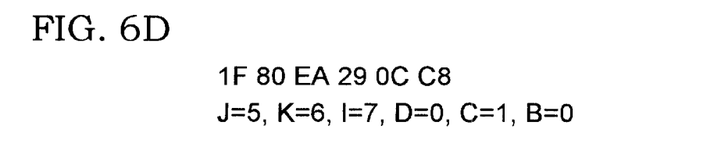

On the next iteration of loop 450 (for the second row of the table in FIG. 3A), no changed columns are detected. Thus, the variables and the output buffer remain as shown in FIG. 6C. On the subsequent execution of if statement 460, the else clause 470 will be processed because B has the value zero (since no changes were detected in the current row). Since K has the value 0 at this point, the embedded else clause shown at 480 is executed, setting K to the position in the output buffer where I now points; then moving I to the next sequential position; and setting variable C to 1 (to signify that one non-changing row has been detected). The result of this processing is reflected in FIG. 6D.

Figure 6E:
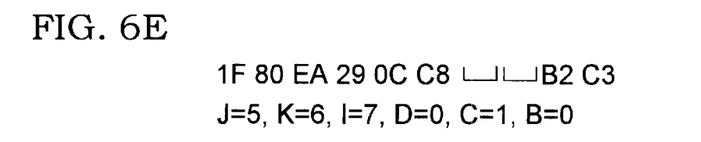

Control then returns to the top of loop 440 to begin processing the third row in the example input table. Loop 450 will detect changes in columns 2 and 5. Accordingly, changed column counter D will be set to 2; bit mask B will be set to 0x09 ('0000 1001'B); the changed values B2 and C3 will be stored in the output buffer at positions 8 and 9; and these changed values will also be remembered in the previous row buffer at P[2] and P[5]. This result is shown in FIG. 6E.

Figure 6F:
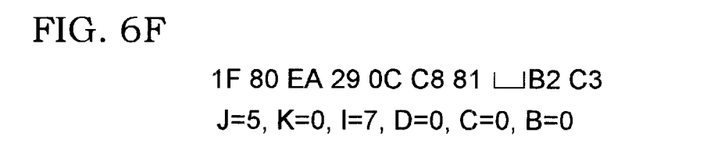

Because changes were detected in the current row, bit mask B has a non-zero value and thus if clause 460 will be executed next. K now has a non-zero value as well, since a non-changed row (row 2) has been detected on the previous iteration. Thus, the embedded if statement at 465 executes and creates a marker byte. The existing count of non-changed rows in variable in C is used as the basis for the marker byte, which then has its top-order bit set to 1 to signify that it is a marker. The value of the marker byte (in variable C) is then written to the output buffer at position K—that is, in a reserved location that precedes the information that is being written out for the changed row (row 3, in the example) that has forced the generation of the marker byte. The location for the next marker byte (variable K) and the count of non-changing rows (variable C) are then reset. The output buffer and variables thus have the values shown in FIG. 6F.

Figure 6G:
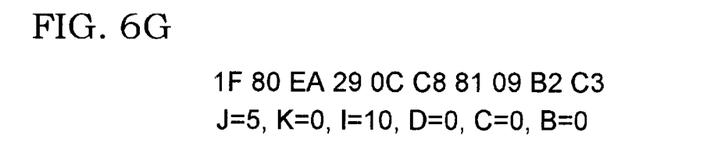

Next, the bit mask for the changed row is written into the output buffer at the position indicated by variable I. This variable is then incremented to point past the information for the current (changed) row by adding (D+1) to I, and the bit mask B and changed column counter D are reset to zero. The output buffer and variables are as shown in FIG. 6G.

Figure 6H:
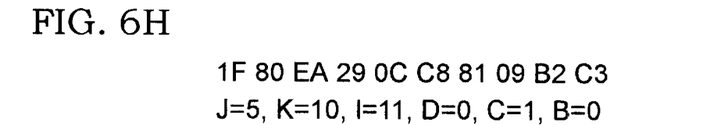
Figure 6I:
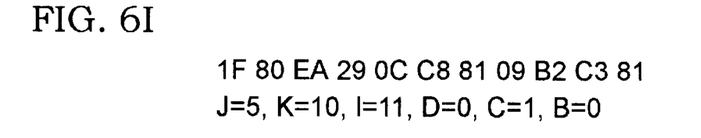

The fourth row of the input table of FIG. 3A is then processed in loop 450, where no changes are detected. Thus, the output buffer and variables remain as shown in FIG. 6G. Because bit mask B has the value zero at this point, else clause 470 executes next. Because K has been reset to zero, the embedded else clause 480 executes and sets K to the position where I has been pointing, increments I, and then sets variable C to indicate that a non-changing row has been processed. See FIG. 6H for the corresponding output buffer and variable values.

Because all 4 rows of the example input table have now been processed, control reaches the if statement at 490. Variable K has a non-zero value, indicating that (at least) one non-changing row has been detected and a marker byte therefore needs to be written into the output buffer. Thus, the non-changing row counter in variable C is made into a marker byte by setting its high-order bit to 1. The value of C is then written into the output buffer at the position indicated by the value of K. See FIG. 6I, which reflects the processing of the entire example table from FIG. 3A (and which shows that the output buffer now matches that shown in FIG. 3B).

If variable K has a zero value upon reaching if statement 490, this indicates that the final row of the input table contains one or more changed columns, and thus it is not necessary to write a marker byte into the output buffer.

The example did not illustrate the processing of the if clause 475 embedded within else clause 470. This logic is executed when there was no change in the current row (i.e. bit mask B=0), and when at least one non-changing row has previously been detected (i.e. K points to some non-zero location in the output buffer that is being reserved for a marker byte). The count of non-changing rows is then incremented in variable C, and C is checked to see if an overflow condition has occurred. An overflow of variable C exists when the 128-th (or multiples thereof) sequential non-changing row is detected, causing bit 7 of C to be set to 1. This condition is handled by writing a marker byte having a value of 0×FF into the output buffer (representing a count of 127, or '0111 1111'B, after replacing the 0 bit in the high-order position with a 1 bit to indicate that this is a marker byte); incrementing K to point to the next available location in the output buffer, thereby reserving space for another marker byte; incrementing I to point past the position for the additional marker byte; and resetting the count of non-changing rows in C to 1.

Preferably, the loop shown at 440 is terminated by testing whether a pointer to the next row in the input table indicates that there are no more rows, and the end of the table has therefore been reached. This approach accommodates a dynamically-growing input table, for which values will continue to be transmitted to reflect only the changes from previously-transmitted values. (Note that while the input table grows as data values are generated for new periodic intervals, the storage used to hold the table does not necessarily grow, as the pertinent content of rows that have been processed will be remembered by the algorithm, and is therefore preferably discarded.)

The actual transmission of the output buffer has not been reflected in the algorithm of FIG. 4. Transmission preferably occurs when the encoded information (or a periodic subset thereof) is complete. In the robot example, this typically corresponds to completing a set of commands for movement of the robot. In a dynamic case (or over a long interval), the encoded information can therefore be sent in chunks and buffered on the receiving system.

Figure 5:
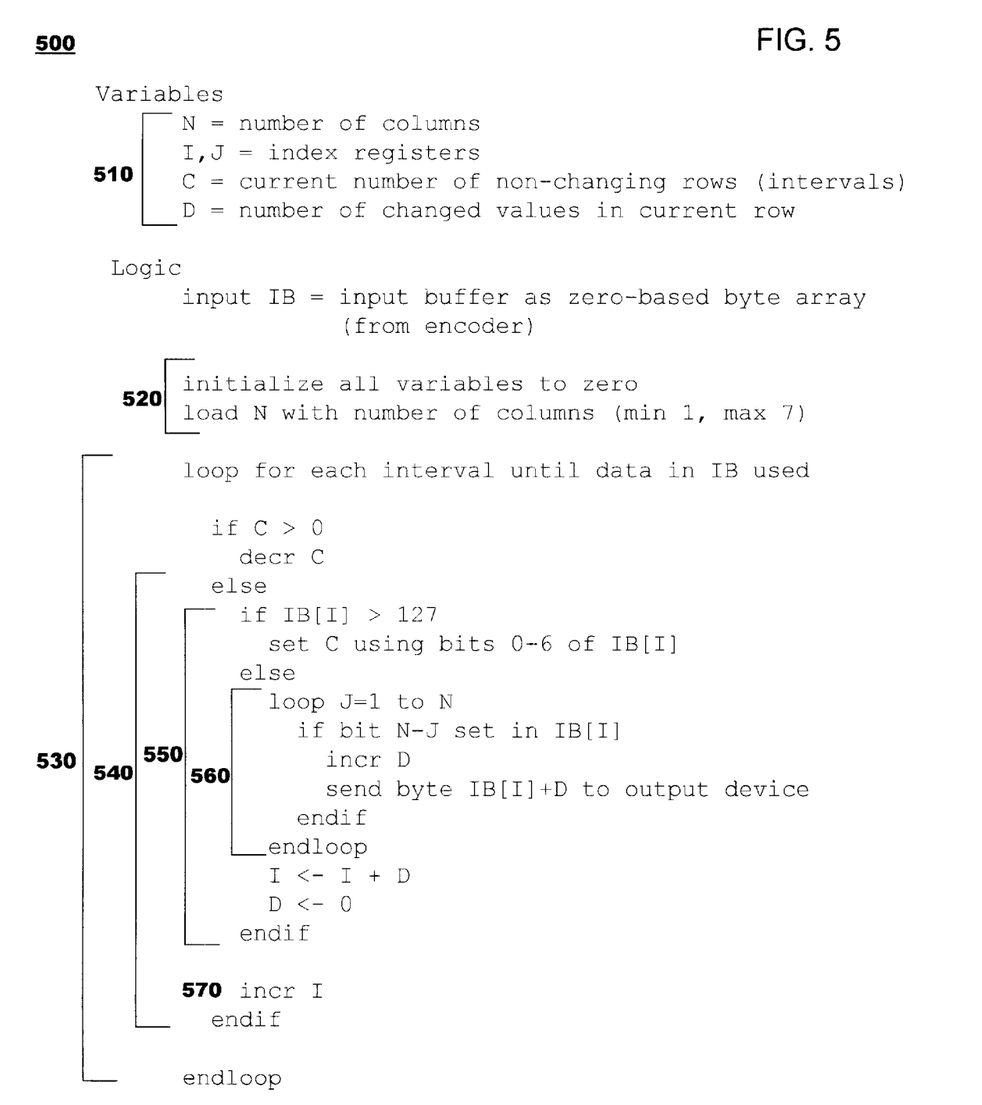

Pseudocode for a decoding algorithm that reverses the transformations performed by the encoding algorithm of FIG. 4 is shown in FIG. 5. This logic executes on the receiving device, and uses variables N, I, J, C, and D (see element 510 of FIG. 5). Variable "N" again reflects the number of columns in the table to be processed. Variable C holds a count of non-changing rows. Variable D counts the number of changed columns in a row. Variables I and J are counters, which are preferably stored in index registers. Variable I is used to index through an input buffer "IB", and variable J is a loop iteration counter.

As shown at 520, the variables are initialized and the value of variable N is learned from the value of the first byte from the received encoded file stored in the input buffer IB (which receives the encoded data transmitted from the sending device). Loop 530 then executes to decode all the rows reflected by this input buffer. When the decoding operation begins, C remains initialized to zero, so else clause 540 executes. The input buffer does not have a value greater than 127 in the I-th position at this point, because variable I still points to the first byte of input (which is a bit mask representing the first row, and which is used to set N). Therefore, the embedded else clause within statement 550 executes.

This embedded else clause within statement 550 begins with a loop 560 that executes to potentially retrieve up to N bytes of data from the decoded input buffer by iterating for (J=1 to N) executions. Each bit in the bit mask stored in the current (I-th) position of the input buffer is inspected to see whether the corresponding column has changed data. If so, then variable D is incremented and the changed column data, which is stored in position (I+D) of the input buffer, is sent to the output device (e.g. to the robot arm axis, when the present invention is used with a robot) for processing.

After loop 560 finishes for the current row, variable I is incremented to point to the (already-decoded) location in the input buffer where D had been pointing, and variable D is reset to indicate that there are as yet no changed columns in the current (i.e. next) row. Variable I is then incremented (see element 570) to point to the next un-decoded location in the input buffer.

Upon reaching a marker byte in the input buffer, the test (IB[I]>127) at the top of if statement 550 will be true (because a marker byte is the only byte having its high-order bit set, and therefore no other bytes have a value >127). In this case, the count of non-changing rows is retrieved from the low-order bits of this byte and used as the value of variable C. The column retrieval process in loop 560 is bypassed (because presence of the marker byte indicates at least one period for which the row did not change), and variable I is moved (see element 570) to point to the byte following the marker byte. When next returning to the top of loop 530, C is greater than zero, so the value in C is decremented. The iterative processing of loop 530 thus comprises repeatedly decrementing C (in effect counting down through the appropriate number of non-changing rows), until C again reaches zero. When C reaches zero, this indicates that the column data for the corresponding period contained at least one change. This changed data is retrieved in loop 560, as has been described. This retrieving of changed column values, and decrementing C for each unchanged row, continues until the entire input buffer has been decoded, at which time the processing represented by FIG. 5 ends.

As has been demonstrated, the encoding technique of the present invention provides a very efficient, compact process for reducing the size of a data stream and thus reducing the I/O and memory requirements of systems (including, in particular, real-time systems and other resource-constrained systems) without loss of data stream content. The corresponding decoding algorithm is also efficient and compact. Furthermore, in a particular application, the efficiencies gained through use of the present invention may make it possible to reduce the periodic interval and thereby increase the granularity of the transmitted information (without degrading operation of the application).

While the preferred embodiment of the present invention has been described, additional variations and modifications in that embodiment may occur to those skilled in the art once they learn of the basic inventive concepts. Therefore, it is intended that the appended claims shall be construed to include both the preferred embodiment and all such variations and modifications as fall within the spirit and scope of the invention.

What is claimed is:

1. A computer program product for efficiently encoding data values that have a vertical correlation, the computer program product embodied on one or more computer readable media and comprising:
    computer-readable program code means for accessing a plurality of data values, wherein the plurality of data values is logically structured as a plurality of rows, each of the rows having a plurality of columns; and
    computer-readable program code means for encoding the plurality of data values as a compressed output stream, further comprising:
        computer-readable program code means for omitting selected ones of the plurality of data values from the output stream, wherein the selected ones are those data values which are repeated from one column in one row to that column in a next-sequential row; and
        computer-readable program code means for indicating the omission in the output data stream without loss of information content.

2. The computer program product according to claim 1, further comprising computer-readable program code means for transmitting the compressed output stream to a receiver.

3. The computer program product according to claim 2, further comprising:
    computer-readable program code means for receiving, at the receiver, the transmitted output stream; and
    computer-readable program code means for decoding the received output stream into the logical structure of the plurality of rows and the plurality of columns.

4. The computer program product according to claim 3, further comprising computer-readable program code means for using the decoded output stream as periodic input for an application.

5. The computer program product according to claim 4, wherein the application is a real-time application.

6. The computer program product according to claim 1, wherein the computer-readable program code means for encoding further comprises:
    computer-readable program code means for creating a marker byte to indicate how many sequential rows have identical data values in each column;
    computer-readable program code means for creating a bit mask for each row that has changed data values, wherein one or more bits in the bit mask are set on for each column in the row which has one of the changed data values; and
    computer-readable program code means for writing the marker bytes and the bit masks into the output stream, along with the changed data values.

7. The computer program product according to claim 1, wherein the data values are byte values.

8. The computer program product according to claim 1, wherein each of the rows represents a periodic set of data values.

9. A system for efficiently encoding data values that have a vertical correlation, comprising:
    means for accessing a plurality of data values, wherein the plurality of data values is logically structured as a plurality of rows, each of the rows having a plurality of columns; and
    means for encoding the plurality of data values as a compressed output stream, further comprising:
        means for omitting selected ones of the plurality of data values from the output stream, wherein the selected ones are those data values which are repeated from one column in one row to that column in a next-sequential row; and
        means for indicating the omission in the output data stream without loss of information content.

10. The system according to claim 9, further comprising means for transmitting the compressed output stream to a receiver.

11. The system according to claim 10, further comprising:
    means for receiving, at the receiver, the transmitted output stream; and
    means for decoding the received output stream into the logical structure of the plurality of rows and the plurality of columns.

12. The system according to claim 11, further comprising means for using the decoded output stream as periodic input for an application.

13. The system according to claim 12, wherein the application is a real-time application.

14. The system according to claim 9, wherein the means for encoding further comprises:
    means for creating a marker byte to indicate how many sequential rows have identical data values in each column;
    means for creating a bit mask for each row that has changed data values, wherein one or more bits in the bit mask are set on for each column in the row which has one of the changed data values; and
    means for writing the marker bytes and the bit masks into the output stream, along with the changed data values.

15. The system according to claim 9, wherein the data values are byte values.

16. The system according to claim 9, wherein each of the rows represents a periodic set of data values.

17. A method for efficiently encoding data values that have a vertical correlation, comprising the steps of;
    accessing a plurality of data values, wherein the plurality of data values is logically structured as a plurality of rows, each of the rows having a plurality of columns; and encoding the plurality of data values as a compressed output stream, further comprising the steps of:
    omitting selected ones of the plurality of data values from the output stream, wherein the selected ones are those data values which are repeated from one column in one row to that column in a next-sequential row; and
    indicating the omission in the output data stream without loss of information content.

18. The method according to claim 17, further comprising the step of transmitting the compressed output stream to a receiver.

19. The method according to claim 18, further comprising the steps of:
    receiving, at the receiver, the transmitted output stream; and
    decoding the received output stream into the logical structure of the plurality of rows and the plurality of columns.

20. The method according to claim 19, further comprising the step of using the decoded output stream as periodic input for an application.

21. The method according to claim 20, wherein the application is a real-time application.

22. The method according to claim 17, wherein the encoding step further comprises the steps of:
    creating a marker byte to indicate how many sequential rows have identical data values in each column;
    creating a bit mask for each row that has changed data values, wherein one or more bits in the bit mask are set on for each column in the row which has one of the changed data values; and
    writing the marker bytes and the bit masks into the output stream, along with the changed data values.

23. The method according to claim 17, wherein the data values are byte values.

24. The method according to claim 17, wherein each of the rows represents a periodic set of data values.

* * * * *